(12) United States Patent
Frank

(10) Patent No.: US 9,917,595 B2
(45) Date of Patent: Mar. 13, 2018

(54) MULTI-LEVEL LADDER DAC WITH INTERCONNECT BETWEEN LADDER NODES

(71) Applicant: TEXAS INSTRUMENTS INCORPORATED, Dallas, TX (US)

(72) Inventor: Aaron L. Frank, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/202,190

(22) Filed: Jul. 5, 2016

(65) Prior Publication Data

US 2017/0155401 A1    Jun. 1, 2017

Related U.S. Application Data

(63) Continuation of application No. 14/823,820, filed on Aug. 11, 2015, now abandoned.

(60) Provisional application No. 62/035,773, filed on Aug. 11, 2014.

(51) Int. Cl.
*H03M 1/78* (2006.01)

(52) U.S. Cl.
CPC .................................. *H03M 1/785* (2013.01)

(58) Field of Classification Search
CPC ......... H03M 1/785; H03M 1/78; H03M 1/808
USPC ......................................... 341/144, 145, 154
See application file for complete search history.

(56) References Cited

U.S. PATENT DOCUMENTS

| | | | |
|---|---|---|---|
| 5,252,975 A * | 10/1993 | Yuasa | H03M 1/682 341/145 |
| 5,554,986 A * | 9/1996 | Neidorff | H03M 1/682 341/145 |
| 5,696,657 A | 12/1997 | Nourrcier, Jr. et al. | |
| 5,703,588 A | 12/1997 | Rivoir et al. | |
| 6,204,791 B1 | 3/2001 | Yamamoto et al. | |
| 6,317,069 B1 * | 11/2001 | Male | H03M 1/785 341/145 |
| 6,433,717 B1 * | 8/2002 | Leung | H03M 1/0663 341/144 |
| 6,529,152 B1 * | 3/2003 | Piasecki | H03M 1/682 341/136 |
| 6,914,547 B1 | 7/2005 | Swaroop et al. | |
| 7,250,891 B2 | 7/2007 | Nishimura | |
| 7,639,166 B2 | 12/2009 | Iijima | |

(Continued)

*Primary Examiner* — Linh Nguyen
(74) *Attorney, Agent, or Firm* — Andrew Viger; Charles A. Brill; Frank D. Cimino

(57) ABSTRACT

A multi-level DAC includes first and second level resistor ladders, and a dual-switch ladder interconnect reduces DNL at tap-point transitions between first-level ladder resistors. For each first level resistor N, the switch-interconnect network includes dual (first/second) switches connectable to a resistor-top node NT, and dual (third/fourth) switches selectively connectable to a resistor-bottom node NB. The first switch is operable to connect NT to a top tap switch operable to select NT as a top tap point, and the fourth interconnect switch is operable to connect NB to a bottom tap switch operable to select NB as a bottom tap point. The first and fourth switches are connected, forming an outer loop that includes top and bottom tap points. The second switch connects to a top second-level resistor RT, and the third switch connects to a bottom second-level resistor RB, forming an inner loop that includes the series-connected second-level resistors.

12 Claims, 2 Drawing Sheets

(56) References Cited

U.S. PATENT DOCUMENTS

| | | |
|---|---|---|
| 8,188,899 B2 | 5/2012 | Motamed |
| 8,907,832 B2 | 12/2014 | Price et al. |
| 8,912,939 B2 | 12/2014 | Dempsey |
| 2006/0232459 A1* | 10/2006 | Dempsey .............. H03M 1/682 341/144 |
| 2011/0102227 A1 | 5/2011 | Motamed |
| 2012/0326907 A1 | 12/2012 | Hirai |

* cited by examiner

MULTI-LEVEL LADDER DAC WITH INTERCONNECT BETWEEN LADDER NODES

CROSS-REFERENCE TO RELATED APPLICATIONS

This application is a continuation of U.S. application Ser. No. 14/823,820, filed Aug. 11, 2015, which claimed priority under U.S.C. § 119(e) to U.S. Provisional Application 62/035,773, filed 11 Aug. 2014), which is incorporated by reference.

BACKGROUND

Technical Field

This Patent Disclosure relates generally to resistor ladder DACs (digital to analog converters), and more particularly to multi-level, multi-ladder DACs.

Related Art

Multi-level resistor ladder DACs can be used to provide extended voltage. The DAC can be configured with switch-interconnect first and second level resistor ladders, with the second-level ladder used to subdivide the voltage range present across a given resistor in the first-level ladder. For example, one possible configuration for a 12 bit DAC would consist of two ladders, with the first consisting of 64 resistors and the second, 63 resistors with 64 tap points. The resistance of all resistors, in both ladders, is the same. When placed in parallel with a given inner ladder resistor, the parallel resistance of the two ladders is 63/64 the resistance of an inner ladder resistor itself.

FIG. 1 illustrates a multi-ladder DAC 10 with first and second level resistor ladders L1, L2. The second-level ladder has taps L2T (for example, 64) that feed into a high impedance buffer input (not shown). The second-level ladder is switch-interconnected through L2 transistor switches ST, SB, respectively to the top and bottom first-level ladder nodes just above and below a selected first-level ladder resistor L1Rn (through L1 node switches L1Sw), forming an L1/L2 resistor ladder loop 12. The L2 switches SB, ST have resistance (Rdson) value Rsw, so that the voltage at the top tap point L2TT is actually IxRsw lower than the voltage at the tap point node N1 just above the selected first-ladder resistor L1RN. The voltage at the bottom tap point is actually IxRsw higher than the voltage at the tap point node N2 just below the selected first-ladder resistor L1Rn. This ladder switch-interconnect configuration results in an error at the transition between the selected first-ladder resistor L1Rn, and the first-level ladder resistor LRn-1 just above it equal to 2IRsw (i.e., at L1 tap node N1 which is the top L1 tap node for resistor L1Rn, and the bottom L1 tap node for resistor L1Rn-1). If the switch resistance is half of the ladder resistor resistance, the DNL (differential non-linearity) error is 1 LSB.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for a multi-level resistor ladder network, such as for use in a DAC (digital-to-analog converter), with dual-switch ladder interconnect.

According to aspects of the Disclosure, a multi-level resistor ladder circuit includes a first-level (L1) resistor ladder, and a second-level (L2) resistor ladder. The L1 resistor ladder includes multiple series-connected L1 resistors, including a resistor L1Rn connected to a previous resistor L1Rn-1 at a respective top L1 ladder node (NT), and to a next resistor (L1Rn+1) at a respective bottom L1 ladder node (NB). The L2 resistor ladder includes multiple series-connected L2 resistors (L2Rn), including a top L2 resistor (L2RT) and a bottom L2 resistor (L2RB), and with intermediate L2 tap nodes (L2Tn) between respective intermediate L2 resistors (L2Rn), each intermediate L2 tap node connected to a respective L2 intermediate tap switch. A switch-interconnect network is operable to selectively connect the second-level resistor ladder across each L1 resistor L1Rn, at the respective L1 ladder nodes NT and NB, and includes first and second interconnect switches selectively connectable to the ladder node NT, and third and fourth interconnect switches selectively connectable to the ladder node NB. The first interconnect switch is operable to connect the L1 ladder node NT to a top L2 tap switch, and the fourth interconnect switch is operable to connect the L1 ladder node NB to a bottom L2 tap switch, and the second interconnect switch is operable to connect the L1 ladder node NT to the top L2 resistor L2RT, and the third interconnect switch is operable to connect the L1 ladder node NB to the bottom L2 resistor L2RB, and each intermediate L2 tap node connected to a respective intermediate L2 tap switch.

Other aspects and features of the invention claimed in this Patent Document will be apparent to those skilled in the art from the following Disclosure.

DETAILED DESCRIPTION

This Description and the Drawings constitute a Disclosure for the multi-level ladder DAC (multi-ladder) with a dual-switch interconnect to (first level) ladder nodes, including example embodiments that illustrate various technical features and advantages. The dual-switch ladder interconnect configuration reduces DNL at tap-point transitions between first-level ladder rungs.

In brief overview, a multi-level DAC includes first and second level resistor ladders, and a dual-switch ladder interconnect reduces DNL at tap-point transitions between first-level ladder resistors. For each first level resistor N, the switch-interconnect network includes dual (first/second) switches connectable to a resistor-top node NT, and dual (third/fourth) switches selectively connectable to a resistor-bottom node NB. The first switch is operable to connect NT to a top tap switch operable to select NT as a top tap point, and the fourth interconnect switch is operable to connect NB to a bottom tap switch operable to select NB as a bottom tap point. The first and fourth switches are connected, forming an outer loop that includes top and bottom tap points. The second switch connects to a top second-level resistor RT, and the third switch connects to a bottom second-level resistor RB, forming an inner loop that includes the series-connected second-level resistors.

Figure 1:
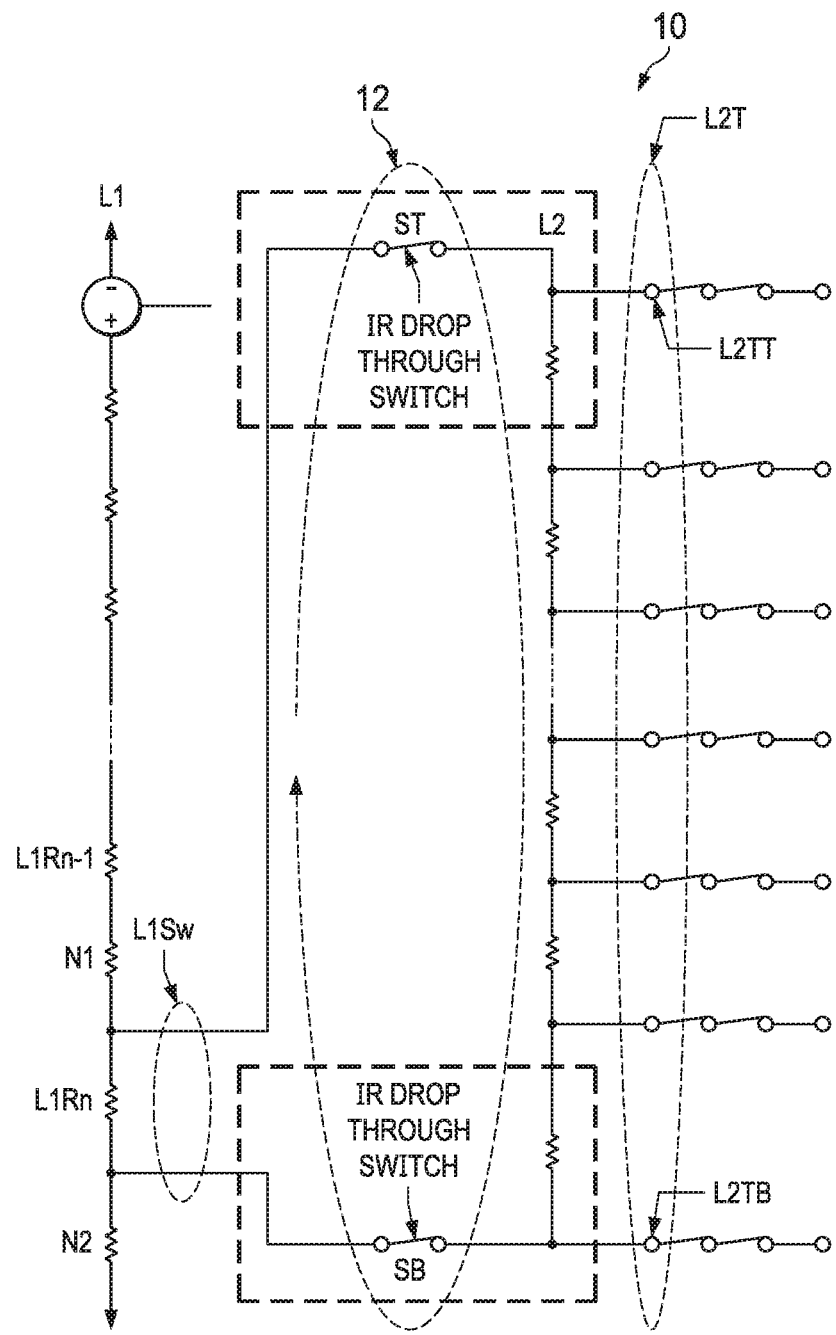
FIG. 1 illustrates a prior art multi-ladder DAC, including switch-interconnect between a first (inner) ladder [L1], and a second (outer) ladder [L2].
Figure 2:
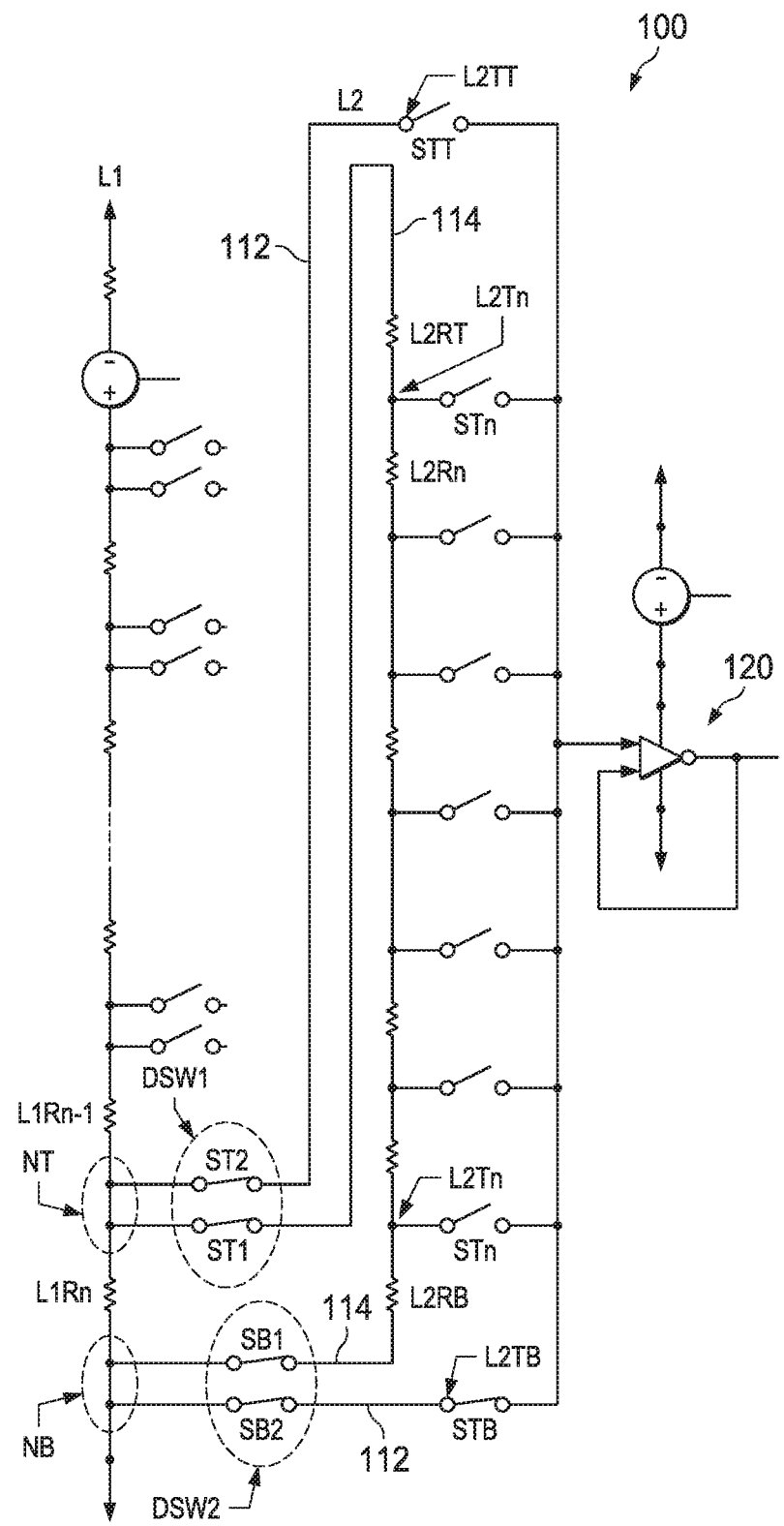
FIG. 2 illustrates an example embodiment of a multi-level ladder DAC with dual-switch interconnect to first-level ladder nodes, reducing DNL error from tap-point transitions between first-level ladder rungs (the transition between a top tap point of a ladder resistor N, and a bottom tap point of a ladder resistor N-1).

FIG. 2 illustrates an example embodiment of a multi-level ladder DAC 100, with multi-level resistor ladders L1 and L2, coupled to a buffer 120. The resistor ladders L1/L2 are interconnected with a dual switch interconnect according to this Disclosure. The dual-switch interconnect to first-level ladder nodes for L1 ladder resistors (rungs) L1Rn, reduces DNL error from tap-point transitions between first-level ladder rungs L1Rn, L1Rn-1 (i.e., the transition between a top tap point of L1 ladder resistor L1Rn, and a bottom tap point of L1 ladder resistor L1Rn).

The dual-switch interconnect network includes dual switches DSw1, DSW2 for each first-level ladder node resistor L1Rn. That is, for each first-level resistor L1Rn, dual-switches DSW1 with first/second top node switches ST1/ST2, and DSW2 with first/second bottom node switches SB1/SB2, connect to respective top and bottom L1 nodes NT and NB for the resistor L1Rn.

The dual interconnect switches DSW1 and DSW2 respectively include a second set of top/bottom switches ST2, SB2 connected between the respective top and bottom nodes NT/NB for each first-level resistor L1Rn, and respectively the top and bottom L2 tap points L2TT, L2TB of the second-level resistor ladder L2, through respective top and bottom tap switches STT and STB. The top and bottom L2 tap points L2TT, L2TB, and the associated top and bottom tap switches STT and STB, form an outer L2 loop 112. All other second-level intermediate tap points L2Tn, and associated intermediate tap switches STn, are part of an inner L2 loop tied to the nodes NT/NB above and below each L1 resistor L1Rn through the first set of top and bottom switches ST1 and SB1 (in respectively DSW1 and DSW2).

For a selected first-level resistor L1Rn, the second level top and bottom tap points L2TT and L2TB connect through separate top and bottom node switches ST2, SB2 (and associated L2 tap switches STT, STB) to respective first-level nodes NT/NB of the selected level-one resistor L1Rn (outer loop). The second level resistor ladder L2, with the resistors L2Rn, connects at the top and bottom resistors L2RT, L2RB through separate top and bottom node switches ST1, SB1 (in respectively DSW1, DSW2) to respective first level nodes NT/NB of the selected level-one resistor L1Rn (inner loop). The inner loop includes all second-level intermediate tap points L2Tn, i.e., other than the top and bottom tap points L2TT, L2TB included in the outer loop.

In operation, when a first-level resistor L1Rn is selected, two switches DSW1 (ST1, ST2) above it, and two switches DSW2 (STB1, STB2), close. The two outer switches ST2, SB2 allow the top and bottom rungs of the second-level ladder L2 to be tied to the first-level ladder L1, through the top and bottom L2 tap point L2TT, L2TB without any IR (IxRsw) drop (the two inner second-level switches ST1, SB1 see a high impedance), avoiding error due to IR drop through the tap switches STT, STB.

The second-level top and bottom resistors L2RT, L2RB can be size-adjusted so that the resistance of the top and bottom tap switches STT, STB plus the respective L2 top and bottom resistors L2RT, L2RB are approximately equal to a target resistance. Because no current flows through the top and bottom tap switches STT, STB that tie the top and bottom second-level tap points L2TT, L2TB to the first-level ladder nodes, IRsw error is avoided. Specifically, DNL error is eliminated at the transition between first-level ladder rungs L1Rn, L1Rn-1.

Advantages of a multi-level ladder DAC (multi-ladder) with a dual-switch interconnect to first-level ladder nodes include: (a) reducing DNL at transition tap points, and (b) enabling use of lower resistances in the second ladder, which reduces RC delay, and increases sampling frequency, while maintaining good DNL at transition points.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. A DAC (digital to analog converter) circuit, comprising
    a first-first level (L1) resistor ladder including multiple series-connected L1 resistors, including a resistor (L1Rn) connected to a previous resistor L1Rn-1 at a respective top L1 ladder node (NT), and to a next resistor (L2Rn+1) at a respective bottom L1 ladder node (NB);
    a second-level (L2) resistor ladder including multiple series-connected L2 resistors (L2Rn), including a top L2 resistor (L2RT) and a bottom L2 resistor (L2RB), and with intermediate L2 tap nodes (L2Tn) between respective intermediate L2 resistors L2Rn, each intermediate L2 tap node connected to a respective L2 intermediate tap switch; and
    a switch-interconnect network to selectively connect the second-level resistor ladder across each L1 resistor L1Rn at the respective L1 ladder nodes NT and NB, including
        first and second interconnect switches selectively connectable to the ladder node NT; and
        third and fourth interconnect switches selectively connectable to the ladder node NB;
    such that,
        the first interconnect switch is operable to connect the L1 ladder node NT to a top L2 tap switch, and
        the fourth interconnect switch is operable to connect the L1 ladder node NB to a bottom L2 tap switch, and
        the second interconnect switch is operable to connect the L1 ladder node NT to the top L2 resistor L2RT, and
        the third interconnect switch is operable to connect the L1 ladder node NB to the bottom L2 resistor L2RB;
    each intermediate L2 tap node connected to a respective intermediate L2 tap switch.

2. The circuit of claim 1, wherein
    the top L2 resistor L2RT is sized such that a resistance of L2RT plus the resistance of the second interconnect switch is equal to a target resistance; and
    the bottom L2 resistor L2RB is sized such that a resistance of L2RB plus the resistance of the third interconnect switch is equal to a target resistance.

3. The circuit of claim 1, wherein:
the top L2 tap switch is operable to select the L1 ladder node NT as a top L2 tap point;
the bottom L2 tap switch is operable to select the L1 ladder node NB as a bottom L2 tap point; and
the L2 intermediate tap switches are operable to select a respective L2 intermediate tap node as a respective L2 intermediate tap point.

4. The circuit of claim 3, wherein:
the first and fourth switches, when connected, form an outer loop that includes the top and bottom L2 tap points.

5. The circuit of claim 3, wherein:
the second and third switches, when connected, form an inner loop that includes the L2 resistors L2Rn and the L2 intermediate tap points.

6. The circuit of claim 1, further comprising:
a driver coupled to the top and bottom L2 tap switches, and to each of the L2 intermediate tap switches, the driver providing a DAC circuit output signal.

7. A multi-level resistor ladder circuit, comprising
a first-first level (L1) resistor ladder including multiple series-connected L1 resistors, including a resistor (L1Rn) connected to a previous resistor L1Rn-1 at a respective top L1 ladder node (NT), and to a next resistor (L1Rn+1) at a respective bottom L1 ladder node (NB);
a second-level (L2) resistor ladder including multiple series-connected L2 resistors (L2Rn), including a top L2 resistor (L2RT) and a bottom L2 resistor (L2RB), and with intermediate L2 tap nodes (L2Tn) between respective intermediate L2 resistors L2Rn, each intermediate L2 tap node connected to a respective L2 intermediate tap switch; and
a switch-interconnect network to selectively connect the second-level resistor ladder across each L1 resistor L1Rn at the respective L1 ladder nodes NT and NB, including
first and second interconnect switches selectively connectable to the ladder node NT; and
third and fourth interconnect switches selectively connectable to the ladder node NB;
such that,
the first interconnect switch is operable to connect the L1 ladder node NT to a top L2 tap switch, and
the fourth interconnect switch is operable to connect the L1 ladder node NB to a bottom L2 tap switch, and
the second interconnect switch is operable to connect the L1 ladder node NT to the top L2 resistor L2RT, and
the third interconnect switch is operable to connect the L1 ladder node NB to the bottom L2 resistor L2RB;
each intermediate L2 tap node connected to a respective intermediate L2 tap switch.

8. The circuit of claim 7, wherein:
the top L2 resistor L2RT is sized such that a resistance of L2RT plus the resistance of the second interconnect switch is equal to a target resistance; and
the bottom L2 resistor L2RB is sized such that a resistance of L2RB plus the resistance of the third interconnect switch is equal to a target resistance.

9. The circuit of claim 7, wherein:
the top L2 tap switch is operable to select the L1 ladder node NT as a top L2 tap point;
the bottom L2 tap switch is operable to select the L1 ladder node NB as a bottom L2 tap point; and
the L2 intermediate tap switches are operable to select a respective L2 intermediate tap node as a respective L2 intermediate tap point.

10. The circuit of claim 9, wherein:
the first and fourth switches, when connected, form an outer loop that includes the top and bottom L2 tap points.

11. The circuit of claim 9, wherein:
the second and third switches, when connected, form an inner loop that includes the L2 resistors L2Rn and the L2 intermediate tap points.

12. The circuit of claim 1, wherein the circuit is included in a DAC (digital to analog converter) circuit, with the top and bottom L2 tap switches, and each of the L2 intermediate tap switches, coupled to a driver that provides a DAC circuit output signal.

* * * * *